United States Patent
Cherkassky

(10) Patent No.: US 8,536,912 B2
(45) Date of Patent: Sep. 17, 2013

(54) PHASE LOCKED LOOP

(75) Inventor: Alexander Cherkassky, Boyds, MD (US)

(73) Assignee: Texas Instruments Incorporated, Dallas, TX (US)

( * ) Notice: Subject to any disclaimer, the term of this patent is extended or adjusted under 35 U.S.C. 154(b) by 3 days.

(21) Appl. No.: 13/191,178

(22) Filed: Jul. 26, 2011

(65) Prior Publication Data

US 2013/0027101 A1    Jan. 31, 2013

(51) Int. Cl.
*H03L 7/06* (2006.01)

(52) U.S. Cl.
USPC .................. 327/157; 327/156; 327/158

(58) Field of Classification Search
USPC .............. 327/156–158; 331/18, 19, 25, 34, 331/16, 17; 375/373–376
See application file for complete search history.

(56) References Cited

U.S. PATENT DOCUMENTS

| | | | |
|---|---|---|---|
| 7,167,056 B2 | 1/2007 | Fang et al. | |
| 7,298,221 B2 | 11/2007 | Yan | |
| 7,777,577 B2 | 8/2010 | Jennings et al. | |
| 2007/0126512 A1 | 6/2007 | Bellaouar et al. | |
| 2007/0159262 A1 | 7/2007 | Quan et al. | |
| 2009/0153254 A1* | 6/2009 | Yu et al. | 331/16 |
| 2011/0006820 A1* | 1/2011 | Liu et al. | 327/157 |
| 2011/0025386 A1 | 2/2011 | Lamanna et al. | |
| 2011/0084743 A1* | 4/2011 | Chen | 327/157 |

OTHER PUBLICATIONS

U.S. Appl. No. 12/726,190, filed Mar. 17, 2010.
PCT Search Report mailed Jan. 29, 2013.

* cited by examiner

*Primary Examiner* — John Poos
(74) *Attorney, Agent, or Firm* — Alan A. R. Cooper; W. James Brady, III; Frederick J. Telecky, Jr.

(57) ABSTRACT

A method for generating a signal is provided. A control signal is generated in response to a comparison between a reference signal and a feedback signal. Then, charge is provided to first and second low pass filters (LPFs). The first and second LPFs have first and second bandwidths, respectively, and the second bandwidth is greater than the first bandwidth. First and second gains are then applied to the outputs from the first and second LPFs, respectively, so as to generate first and second voltages, respectively. The first gain is also greater than the second gain. The feedback signal is then generated from the sum of the first and second voltages.

13 Claims, 2 Drawing Sheets

PHASE LOCKED LOOP

TECHNICAL FIELD

The invention relates generally to a phase locked loop (PLL) and, more particularly, to a PLL having improved phase noise and jitter.

BACKGROUND

Turning to FIG. 1, an example of a conventional PLL 100 can be seen. In operation, the phase/frequency detector (PFD) 102 generates up and down control signal for the charge pump 104 in response to the phase error between the reference signal REF and feedback signal FB from divider 110. The charge pump 104 then applies the appropriate current (charge) to the low pass filter (LPF) 106 (which is generally comprised of capacitors C1 and C2 and resistor R1). The LPF 106 then provides a voltage to the control node of voltage controlled oscillator (VCO) 108 (which is an all-CMOS VCO). Because VCO 108 is an all-CMOS VCO, PLL 100 suffers from excessive phase noise and jitter caused by the LPF 106. This is largely due to very high VCO gain ($K_{VCO}$) of CMOS oscillators (within VCO 108), which effectively multiplies the noise from the filter resistor R1 modulating the control node of the VCO 108. Thus, the noise from LPF 106 is the dominant noise source, limiting the performance.

Therefore, there is a need for an improved PLL.

Some examples of conventional circuits are: U.S. Pat. Nos. 7,167,056; 7,298,221; and U.S. patent application Ser. No. 12/726,190.

SUMMARY

An embodiment of the present invention, accordingly, provides an apparatus. The apparatus comprises a phase/frequency detector (PFD) that receives a reference signal; a charge pump that is coupled to the PFD; a first gain control circuit that is coupled to the charge pump, wherein the first gain control circuit has a first gain and a first response; a second gain control circuit that is coupled to the charge pump, wherein the second gain control circuit has a second gain and a second response, and wherein the second gain is greater than the first gain, and wherein the first response is greater than the second response; a summing circuit that is coupled to the first and second gain control circuits; and a voltage controlled oscillator (VCO) that is coupled to the summing circuit and the PFD.

In accordance with an embodiment of the present invention, the apparatus further comprises a divider that is coupled between the VCO and the PFD.

In accordance with an embodiment of the present invention, the first gain control circuit further comprises: a low pass filter (LPF) that is coupled to the charge pump; and a gain circuit that is coupled between the LPF and the summing circuit.

In accordance with an embodiment of the present invention, the LPF further comprises a first LPF having a first bandwidth that at least in part produces the first response, and wherein the gain circuit further comprises a first gain circuit having the first gain, and wherein the second gain control circuit further comprises: a second LPF that is coupled to the charge pump, wherein the second LPF has a second bandwidth that at least in part produces the second response; and a second gain circuit that is coupled between the second LPF and summing circuit.

In accordance with an embodiment of the present invention, the VCO further comprises a plurality of delay cells coupled in series together to form a ring, wherein each delay cell is coupled to the summing circuit.

In accordance with an embodiment of the present invention, a method is provided. The method comprises generating a control signal in response to a comparison between a reference signal and a feedback signal; providing charge to first and second LPFs having first and second bandwidths, respectively, wherein the second bandwidth is greater than the first bandwidth; applying first and second gains to the outputs from the first and second LPFs, respectively, so as to generate first and second voltages, respectively, wherein the first gain is greater than the second gain; and generating the feedback signal from the sum of the first and second voltages.

In accordance with an embodiment of the present invention, the control signal further comprises a first control signal and a second control signal, and wherein the step of generating the control signal further comprises: generating a phase error from a comparison between the reference signal and the feedback signal; and generating the first and second control signals in response to the phase error.

In accordance with an embodiment of the present invention, step of generating the feedback signal further comprises: applying the sum to a plurality delay cells of a delay line, wherein each delay cell is coupled in series together to form a ring; and generating the feedback signal from a tap on the delay line.

In accordance with an embodiment of the present invention, an apparatus is provided. The apparatus comprises a PFD that receives a reference signal; a charge pump that is coupled to the PFD; a first resistor-capacitor (RC) filter that is coupled to the charge pump having a first bandwidth; a second RC filter that is coupled to the charge pump having a second bandwidth, wherein the second bandwidth is greater than the first bandwidth; a first gain circuit that is coupled to the first RC filter, wherein the first gain circuit has a first gain; a second gain circuit that is coupled to the second RC filter, wherein the second gain circuit has a second gain, and wherein the first gain is greater than the second gain; a summing circuit that is coupled to the first and second gain circuits; and a voltage controlled oscillator (VCO) that is coupled to the summing circuit and the PFD.

In accordance with an embodiment of the present invention, the apparatus further comprises first and second supply rails, and wherein first RC filter further comprises: a resistor that is coupled between the charge pump and the first gain circuit; and a capacitor that is coupled between the first supply rail and the first gain circuit.

In accordance with an embodiment of the present invention, the resistor further comprises a first resistor, and wherein the capacitor further comprises a first capacitor, and wherein the second RC filter further comprises: a second capacitor that is coupled to the first supply rail; a second resistor that is coupled to the second gain circuit, the second capacitor, and the charge pump; and a third capacitor that is coupled between the first supply rail and the second gain circuit.

In accordance with an embodiment of the present invention, the first gain circuit further comprises a MOS transistor that is coupled to the first supply rail at its source, the summing circuit at its drain, and the first resistor and first capacitor at its gate.

In accordance with an embodiment of the present invention, the MOS transistor further comprises a first MOS transistor, and wherein the second gain circuit further comprises a second that is coupled MOS capacitor that is coupled to the first supply rail at its source, the summing circuit at its drain, and the second resistor, third capacitor, and charge pump at its gate.

In accordance with an embodiment of the present invention, the summing circuit further comprises a node.

In accordance with an embodiment of the present invention, the first and second MOS transistors further comprise first and second PMOS transistors, respectively.

In accordance with an embodiment of the present invention, the VCO further comprises a plurality of delay cells coupled in series together to form a ring, wherein each delay cell is coupled to the summing circuit.

In accordance with an embodiment of the present invention, each delay cell further comprises: a first inverter having an input terminal, an output terminal, a first power terminal, and a second power terminal, wherein the first power terminal of the first inverter is coupled to the summing circuit, and wherein the second power terminal of the first inverter is coupled to the second supply rail; a second inverter having an input terminal, an output terminal, a first power terminal, and a second power terminal, wherein the first power terminal of the second inverter is coupled to the summing circuit, and wherein the second power terminal of the second inverter is coupled to the second supply rail; a third inverter having an input terminal, an output terminal, a first power terminal, and a second power terminal, wherein the first power terminal of the third inverter is coupled to the summing circuit, and wherein the second power terminal of the third inverter is coupled to the second supply rail, and wherein the input terminal of the third inverter is coupled to the output terminal of the second inverter, and wherein the output terminal of the third inverter is coupled to the output terminal of the first inverter; and a first inverter having an input terminal, an output terminal, a first power terminal, and a second power terminal, wherein the first power terminal of the first inverter is coupled to the summing circuit, and wherein the second power terminal of the first inverter is coupled to the second supply rail, and wherein the input terminal of the fourth inverter is coupled to the output terminal of the first inverter, and wherein the output terminal of the fourth inverter is coupled to the output terminal of the second inverter.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
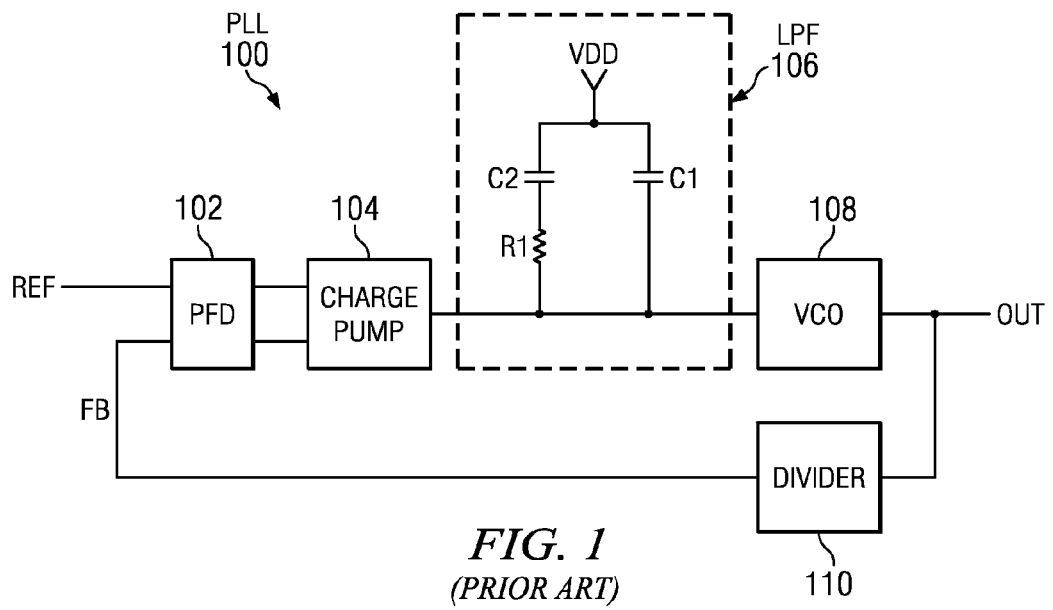
FIG. 1 is a diagram of an example of a conventional PLL.

Refer now to the drawings wherein depicted elements are, for the sake of clarity, not necessarily shown to scale and wherein like or similar elements are designated by the same reference numeral through the several views.

Figure 2:
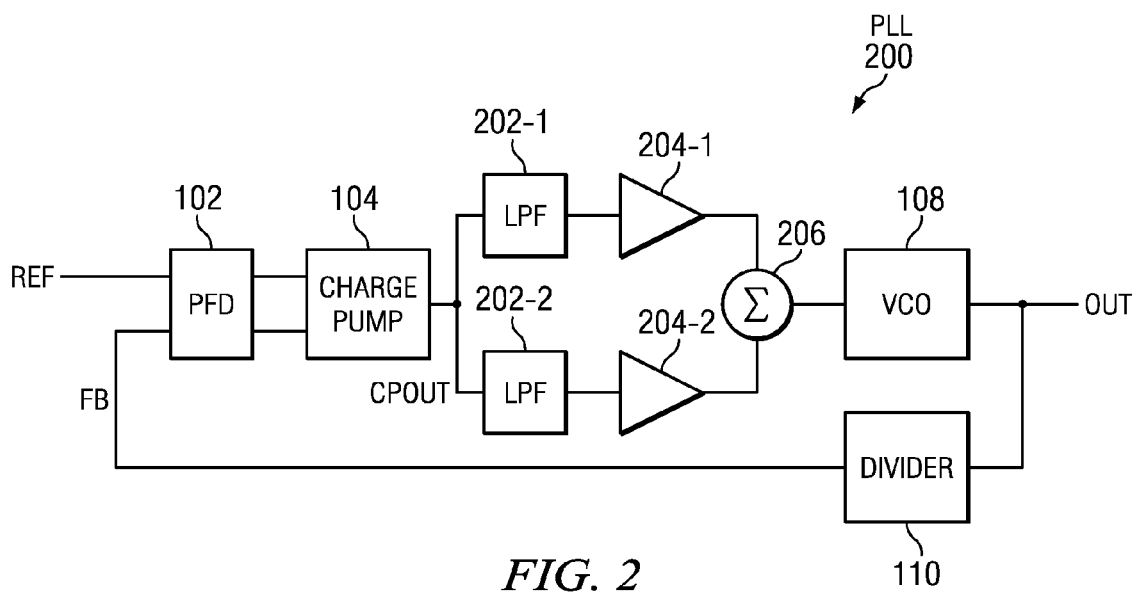
FIG. 2 is a diagram of an example of a PLL in accordance with an embodiment of the present invention.

Turning to FIG. 2, an example of a PLL 200 in accordance with an embodiment of the present invention is shown. This PLL 200 is generally configured to have the same loop bandwidth and phase margin as PLL 100, and PLL 200 is similar in structure to that of PLL 100, except that LPF 106 has been replaced by several gain control circuits and a summing circuit 206. The number of gain control circuits can vary depending on the application, but, as an example and for the sake of simplicity of illustration, two gain control circuits are shown. These gain control circuits are generally comprised of LPFs 202-1 and 202-2 and gain circuits 204-1 and 204-2. The responses or speeds (i.e., being fast or slow) and gains for these gain control loops can be varied with respect to one another so as to dampen noise from the one or more of the LPFs 202-1 and 202-2. As an example, the gain control circuit having LPF 202-1 and gain circuit 204-1 can have a lower response (slower) and a higher gain (higher $K_{VCO}$) than the gain control circuit having LPF 202-2 and gain circuit 204-2.

Figure 3:
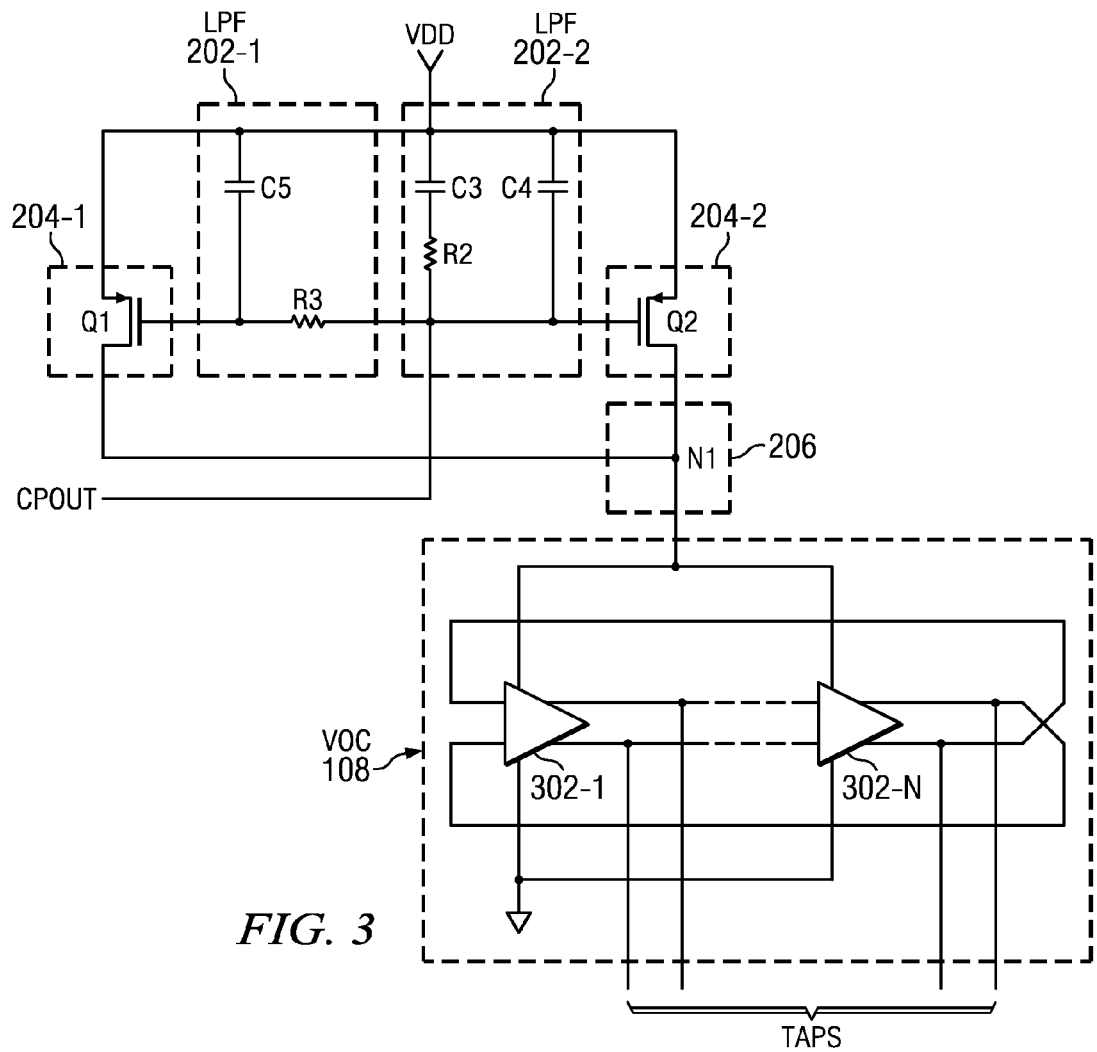
FIG. 3 is a diagram of an example of the LPFs and VCO of the PLL of FIG. 2.

In FIG. 3, these gain control circuits and VCO 108 can be seen in greater detail. As shown in this example, each of LPFs 202-1 and 202-2 are coupled to the charge pump 104 so as to receive signal CPOUT. LPF 202-2 has a similar configuration LPF 106 in that it includes two capacitors (i.e., capacitors C3 and C4) and a resistor (i.e., resistor R2), while LPF 202-1 includes resistor R3 and capacitor C5. The inclusion of resistor R3 and capacitor C5 introduces an additional zero and an additional pole, but the stability and dynamic performance should not be affected because resistor R3 and capacitor C5 can be chosen such that the additional pole and zero are at relatively low frequencies. In operation, the gain control circuit having LPF 202-2 and gain circuit 204-2 has a high bandwidth and a high response (i.e., fast), but the gain circuit 204-2 (which can be an NMOS transistor Q2 that is coupled to supply rail VDD) has a low gain. This means that that the noise from resistor R2 modulates delay elements 302-1 to 302-N of VCO 108 through summing circuit 206 (which can, for example, be node N1) at a low gain so as to reduce the impact of the noise from resistor R2. In contrast, the gain control circuit having LPF 202-1 and gain circuit 204-1 (which can, for example, be a PMOS transistor Q1), has a low bandwidth and a low response (i.e., slow). Because the pole introduced by resistor R3 and capacitor R5 is at a relatively low frequency, the high gain for gain circuit 204-1 will result in resistor R3 (which is coupled between charge pump 104 and gain control circuit 204-1) having virtually no impact on noise performance.

Figure 4:
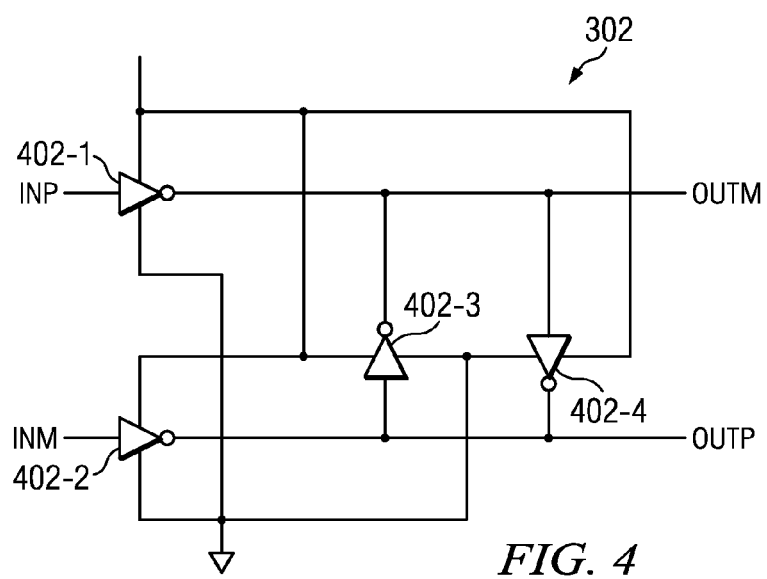
FIG. 4 is a diagram of an example of a delay cell of the VCO of FIG. 3.

As shown in FIG. 3, delay elements 302-1 to 302-N of VCO 108 are coupled together with one another to form a ring such that an output signal can be derived from at least one of the taps. An example of each of the delay elements 302-1 to 302-N (hereinafter 302) is shown in greater detail in FIG. 4. Each inverter 402-1 to 402-4 is coupled at its power terminals to the summing circuit 206 and a supply rail (i.e., ground). Inverters 402-1 and 402-2 invert the differential input signal INM and INP, and inverters 402-3 and 402-4 hold the values at the out terminals of inverters 402-1 and 402-2 (namely, the differential output signal OUTP and OUTM).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a phase/frequency detector (PFD) that receives a reference signal;
   a charge pump that is coupled to the PFD;
   a first gain control circuit that is coupled to the charge pump, wherein the first gain control circuit has a first gain and a first response;
   a second gain control circuit that is coupled to the charge pump, wherein the second gain control circuit has a second gain and a second response, and wherein the second gain is greater than the first gain, and wherein the first response is greater than the second response;
   a summing circuit that is coupled to the first and second gain control circuits; and
   a voltage controlled oscillator (VCO) that is coupled to the summing circuit and the PFD,
   wherein the apparatus further comprises a divider that is coupled between the VCO and the PFD,
   wherein the first gain control circuit further comprises:
   a low pass filter (LPF) that is coupled to the charge pump; and
   a gain circuit that is coupled between the LPF and the summing circuit.

2. The apparatus of claim 1, wherein the first gain control circuit further comprises a first LPF having a first bandwidth that at least in part produces the first response, and wherein the gain circuit further comprises a first gain circuit having the first gain, and wherein the second gain control circuit further comprises:
   a second LPF that is coupled to the charge pump, wherein the second LPF has a second bandwidth that at least in part produces the second response; and
   a second gain circuit that is coupled between the second LPF and summing circuit.

3. The apparatus of claim 2, wherein the VCO further comprises a plurality of delay cells coupled in series together to form a ring, wherein each delay cell is coupled to the summing circuit.

4. A method comprising:
   generating a control signal in response to a comparison between a reference signal and a feedback signal;
   providing charge to first and second LPFs having first and second bandwidths, respectively, wherein the second bandwidth is greater than the first bandwidth;
   applying first and second gains to the outputs from the first and second LPFs, respectively, so as to generate first and second voltages, respectively, wherein the first gain is greater than the second gain; and
   generating the feedback signal from the sum of the first and second voltages,
   wherein the control signal further comprises a first control signal and a second control signal, and wherein the step of generating the control signal further comprises:
   generating a phase error from a comparison between the reference signal and the feedback signal; and
   generating the first and second control signals in response to the phase error.

5. The method of claim 4, wherein step of generating the feedback signal further comprises:
   applying the sum to a plurality delay cells of a delay line, wherein each delay cell is coupled in series together to form a ring; and
   generating the feedback signal from a tap on the delay line.

6. An apparatus comprising:
   a PFD that receives a reference signal;
   a charge pump that is coupled to the PFD;
   a first resistor-capacitor (RC) filter that is coupled to the charge pump having a first bandwidth;
   a second RC filter that is coupled to the charge pump having a second bandwidth, wherein the second bandwidth is greater than the first bandwidth;
   a first gain circuit that is coupled to the first RC filter, wherein the first gain circuit has a first gain;
   a second gain circuit that is coupled to the second RC filter, wherein the second gain circuit has a second gain, and wherein the first gain is greater than the second gain;
   a summing circuit that is coupled to the first and second gain circuits; and
   a VCO that is coupled to the summing circuit and the PFD,
   wherein the apparatus further comprises a divider that is coupled between the VCO and the PFD,
   wherein the apparatus further comprises first and second supply rails, and wherein first RC filter further comprises:
   a resistor that is coupled between the charge pump and the first gain circuit; and
   a capacitor that is coupled between the first supply rail and the first gain circuit.

7. The apparatus of claim 6, wherein the resistor further comprises a first resistor, and wherein the capacitor further comprises a first capacitor, and wherein the second RC filter further comprises:
   a second capacitor that is coupled to the first supply rail;
   a second resistor that is coupled to the second gain circuit, the second capacitor, and the charge pump; and
   a third capacitor that is coupled between the first supply rail and the second gain circuit.

8. The apparatus of claim 7, wherein the first gain circuit further comprises a MOS transistor that is coupled to the first supply rail at its source, the summing circuit at its drain, and the first resistor and first capacitor at its gate.

9. The apparatus of claim 8, wherein the MOS transistor further comprises a first MOS transistor, and wherein the second gain circuit further comprises a second MOS transistor that is coupled to a second capacitor that is coupled to the first supply rail at its source, the summing circuit at its drain, and the second resistor, third capacitor, and charge pump at its gate.

10. The apparatus of claim 9, wherein the summing circuit further comprises a node.

11. The apparatus of claim 10, wherein the first and second MOS transistors further comprise first and second PMOS transistors, respectively.

12. The apparatus of claim 11, wherein the VCO further comprises a plurality of delay cells coupled in series together to form a ring, wherein each delay cell is coupled to the summing circuit.

13. The apparatus of claim 12, wherein each delay cell further comprises:
    a first inverter having an input terminal, an output terminal, a first power terminal, and a second power terminal, wherein the first power terminal of the first inverter is coupled to the summing circuit, and wherein the second power terminal of the first inverter is coupled to the second supply rail;

a second inverter having an input terminal, an output terminal, a first power terminal, and a second power terminal, wherein the first power terminal of the second inverter is coupled to the summing circuit, and wherein the second power terminal of the second inverter is coupled to the second supply rail;

a third inverter having an input terminal, an output terminal, a first power terminal, and a second power terminal, wherein the first power terminal of the third inverter is coupled to the summing circuit, and wherein the second power terminal of the third inverter is coupled to the second supply rail, and wherein the input terminal of the third inverter is coupled to the output terminal of the second inverter, and wherein the output terminal of the third inverter is coupled to the output terminal of the first inverter; and a first inverter having an input terminal, an output terminal, a first power terminal, and a second power terminal, wherein the first power terminal of the first inverter is coupled to the summing circuit, and wherein the second power terminal of the first inverter is coupled to the second supply rail, and wherein the input terminal of the fourth inverter is coupled to the output terminal of the first inverter, and wherein the output terminal of the fourth inverter is coupled to the output terminal of the second inverter.

\* \* \* \* \*